United States Patent [19]

O'Leary

[11] Patent Number: 4,806,804
[45] Date of Patent: Feb. 21, 1989

[54] MOSFET INTEGRATED DELAY LINE FOR DIGITAL SIGNALS

[75] Inventor: Paul O'Leary, Gundelfingen, Fed. Rep. of Germany

[73] Assignee: Deutsche ITT Industries GmbH, Freiburg, Fed. Rep. of Germany

[21] Appl. No.: 23,211

[22] Filed: Mar. 9, 1987

[30] Foreign Application Priority Data

Mar. 12, 1986 [EP] European Pat. Off. ........ 86 103301.7

[51] Int. Cl.$^4$ ...................... H03K 17/28; H03K 19/00
[52] U.S. Cl. .................................. 307/605; 307/606; 307/451; 307/469
[58] Field of Search ................ 307/605, 606, 451, 469

[56] References Cited

U.S. PATENT DOCUMENTS

| | | | |
|---|---|---|---|
| 4,260,959 | 4/1981 | Allgood | 331/111 |
| 4,387,349 | 6/1983 | Rapp | 331/116 |
| 4,438,352 | 3/1984 | Mardkha | 307/451 |
| 4,489,342 | 12/1984 | Gollinger et al. | 307/605 |
| 4,565,934 | 1/1986 | Southerland, Jr. | 307/605 |
| 4,613,772 | 9/1986 | Young | 307/451 |
| 4,712,021 | 12/1987 | Gollinger | 307/451 |

FOREIGN PATENT DOCUMENTS

| | | |
|---|---|---|
| 0171022 | 2/1986 | European Pat. Off. |
| 0175501 | 3/1986 | European Pat. Off. |
| 55-111118 | 8/1980 | Japan |
| 5961312 | 4/1984 | Japan |

*Primary Examiner*—Stanley D. Miller
*Assistant Examiner*—Huy K. Mai
*Attorney, Agent, or Firm*—Thomas L. Peterson

[57] ABSTRACT

For continuously adjusting the time delay of this delay line the latter is designed to consist of stages (l, n) which are of the same kind, and contains per stage a conventional CMOS inverter to which, on the P-channel transistor side, a P-channel constant-current transistor and, on the N-channel transistor side, an N-channel constant-current transistor is connected in series. The N-channel constant-current transistors form part of an N-channel multiple current mirror, and likewise, the P-channel constant-current transistors form part of a P-channel multiple current mirror. Among each other all transistors of the two current mirrors are capable of conducting currents which are equal in terms of magnitude and equal in relation to an adjustable reference current.

2 Claims, 1 Drawing Sheet

MOSFET INTEGRATED DELAY LINE FOR DIGITAL SIGNALS

BACKGROUND OF THE INVENTION

The present invention relates to insulated-gate field-effect transistor integrated delay lines for digital signals comprising inverters connected in series with respect to the signal flow. The underlying principle of such a delay line is disclosed in the published patent application EP-A-59 802 (ITT case W. Gollinger et al 14-13-12-9-3-2, corresponding to U.S. Pat. No. 4,489,342). The time delay is made adjustable in equidistant steps by providing that the output of every second invert can be taken off via a one-out-of-n selector switch.

SUMMARY OF THE INVENTION

It is one object of the invention to provide a delay line for digital signals, whose time delay is continually adjustable electrically.

While in the arrangement described herein before the inverters are of the type comprising a load transistor connected as a resistor, viz. where the two inverter transistors are of the same conductivity type, it is possible with the aid of the invention, by designing the inverters as CMOS inverters and connecting them to the two poles of the source of supply voltage respectively via a constant-current transistor, to obtain the desired continual, electrical adjustability of the time delay, which is effected in that the constant-current transistors are dimensioned with respect to the conductance of equal currents, with the amplitudes of these currents being jointly adjustable via a reference current.

BRIEF DESCRIPTION OF THE DRAWING

The invention will now be explained in greater detail with reference to FIGS. 1 and 2 of the accompanying drawings, in which.

DETAILED DESCRIPTION

Figure 1:
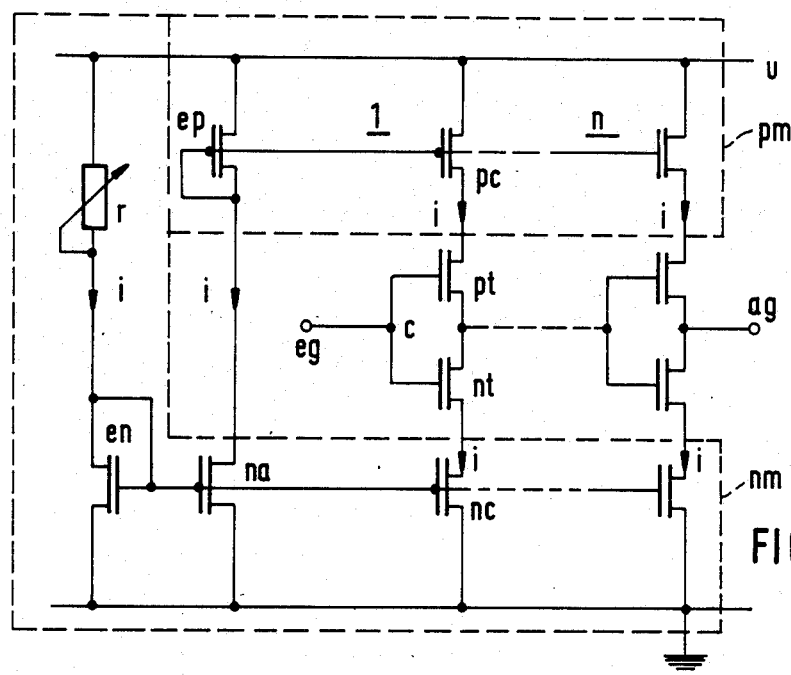
FIG. 1 shows the first and the last stage of an exemplified embodiment of the delay line according to the invention together with the necessary current mirrors.

In the embodiment of FIG. 1 there is shown the first stage 1 and the last stage n of the delay line. Among each other the individual stages are of equal design as follows: Toward the series arrangement of the controlled current paths of the N-channel transistor nt and of the P-channel transistor pt forming the usual CMOS inverter c, whose interconnected gates represent the digital signal input eg, and whose current-path connecting point represents the digital signal output ag, there is connected on the side of the N-channel transistor nt the N-channel constant-current transistor nc and, on the side of the P-channel transistor pt the P-channel constant-current transistor pc in series to the respective pole of the source of supply voltage u. Moreover, all N-channel constant-current transistors form part of the N-channel multiple current mirror nm. All P-channel constant-current transistors form part of the P-channel multiple current mirror pm. All of the transistors of the two current mirrors are so dimensioned as to be capable of conducting currents which are equal in terms of magnitude and equal in relation to the adjustable reference current i. The adjustability of the reference current i is symbolized in the example of embodiment as shown in FIG. 1 by the variable resistor r as connected to both the source of supply voltage u and the input transistor en of the N-current mirror mn. The current i as impressed upon the input transistor en, however, may also be produced in a different way than with the aid of a resistor. Thus, for example, it may be the controlling quantity in a phase-locked loop. The input transistor ep of the P-current mirror has its own reference current i impressed by the additional P-channel constant-current transistor na of the N-current mirror.

The invention takes advantage of the CMOS inverter property according to which, in dependence upon the binary signal level H or L being applied to the input, either the P-channel transistor pt is rendered conductive and the N-channel transistor nt is rendered non-conductive or the P-channel transistor pt is rendered non-conductive and the N-channel transistor nt is rendered conductive. In the event of an H/L or L/H signal change, upon exceeding the gate threshold of the still non-conductive transistor which is now just being rendered conductive, the input capacitance of the next stage connected to the output is either charged or discharged by the current i, respectively. As is well known, this discharge is effected linearly and with a slope which is directly in proportion to the current i. Accordingly, the input signal change is delayed per stage in dependence upon the current i and is switched through to the output of each stage with a delay.

Figure 2:
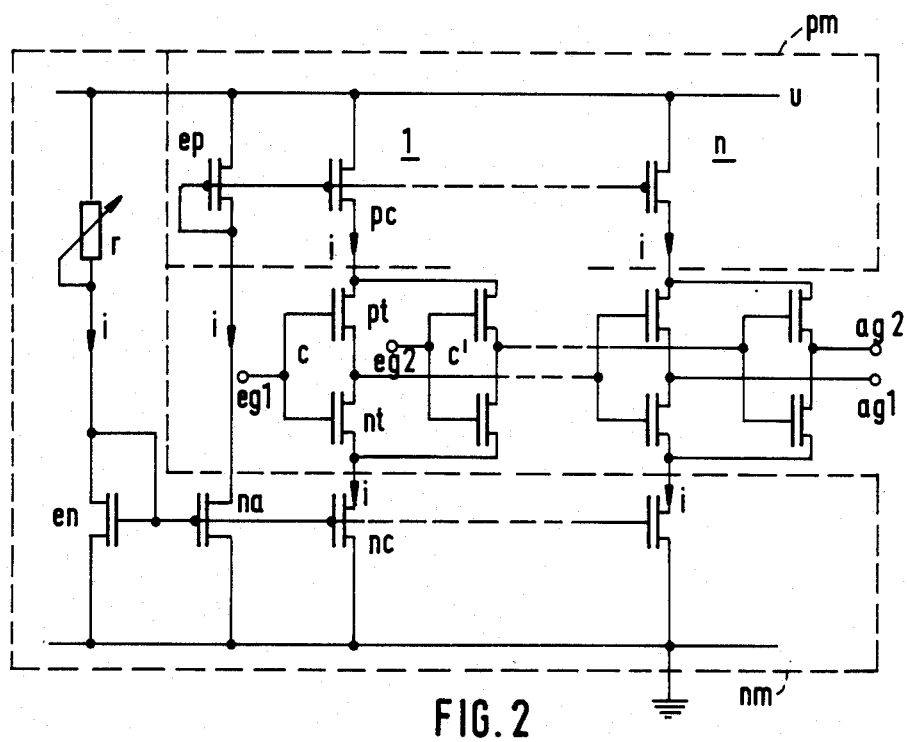
FIG. 2 shows a further embodiment of the arrangement according to FIG. 1.

FIG. 2 illustrates a further embodiment of the arrangement as shown in FIG. 1. In each stage the current path of the further CMOS inverter c' is connected in parallel to the current path of the CMOS inverter c. In that way each stage has the two inputs eg1 (belonging to the CMOS inverter c) and eg2 (belonging to the further CMOS inverter c'), as well as two corresponding outputs. Within the delay line all inputs and outputs of the same kind are interconnected. Accordingly, in one stage there is available the inverted as well as the non-inverted input signal which, in the arrangement according to FIG. 1, is always only capable of being taken off at the next but one stage. In the delay line according to the invention both the ascending and the descending flanks or edges of impulses are well adapted to one another. Moreover, the control characteristic of the delay line is independent of any parameters relating to the manufacturing process. With the aid of the further embodiment of the invention as shown in FIG. 2 the pairwise time delay of the two inverters of one stage can be adjusted to be very low, in particular smaller than one nanosecond, so that the delay line is also suitable for use at very high signal frequencies. This is particularly applicable to cases where, for the realization, a 1.5 micrometer technology is employed. When carefully designing the layout of the delay line, variations in the time delay of the individual stages can be kept below one percent (1%).

Owing to the current mirrors used according to the invention, there results a wide range of variations of the time delay, e.g. around the factor 10. Also, the noise behavior is very good, with this being due to the property of the current mirrors. The arrangement according to the invention operates at a substantially lower noise level than the aforementioned prior-art arrangement.

What is claimed is:

1. A MOSFET integrated delay line for digital signals comprising stages of inverters connected in series with respect to the signal flow, characterized in that:

each inverter in said stages is a conventional type of CMOS inverter formed by the series connection of the controlled current paths of an N-channel transistor and of a P- channel transistor:

toward each CMOS inverter there is connected on the side of the N-channel transistor an N-channel constant-current transistor and, on the side of the P-channel transistor a P-channel constant-current transistor in series to the respective pole of the source of supply voltage;

all of the N-channel constant-current transistors form part of an N-channel multiple current mirror;

all of the P-channel constant-current transistors form part of a P-channel multiple current mirror; and all transistors of the N-channel multiple current mirror and the P-channel multiple current mirror are so dimensioned as to be capable of conducting currents which are equal in terms of magnitude and equal in relation to an adjustable reference current.

2. A MOSFET integrated delay line as claimed in claim 1, wherein:

in each stage the current path of a further CMOS inverter is connected in parallel with the current path of the CMOS inverter, and that in each stage the output of the CMOS inverter is connected to the input of said CMOS inverter of the stage which is the respective next one lying in the direction of signal flow, and the output of of said further CMOS inverter is connected to the input of said further CMOS inverter of the stage which is the respective next one lying in the direction of the signal flow.

* * * * *